United States Patent
Ogasawara

(10) Patent No.: US 8,492,732 B2
(45) Date of Patent: Jul. 23, 2013

(54) MULTI CHARGED PARTICLE BEAM WRITING APPARATUS AND MULTI CHARGED PARTICLE BEAM WRITING METHOD

(71) Applicant: NuFlare Technology, Inc., Numazu (JP)

(72) Inventor: Munehiro Ogasawara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/633,468

(22) Filed: Oct. 2, 2012

(65) Prior Publication Data
US 2013/0082187 A1    Apr. 4, 2013

(30) Foreign Application Priority Data
Oct. 4, 2011    (JP) ................................. 2011-219909

(51) Int. Cl.
*H01J 3/07* (2006.01)
*H01J 37/141* (2006.01)
*G21K 5/04* (2006.01)

(52) U.S. Cl.
USPC ................. 250/396 R; 250/492.2; 250/492.3; 250/492.22; 250/397; 430/296; 430/942

(58) Field of Classification Search
USPC ................. 250/396 R, 492.22, 492.2, 492.3, 250/397; 430/296, 942
See application file for complete search history.

(56) References Cited

U.S. PATENT DOCUMENTS

| | | | |
|---|---|---|---|
| 4,980,567 A | 12/1990 | Yasuda et al. | |
| 5,260,151 A | 11/1993 | Berger et al. | |
| 6,005,250 A | 12/1999 | Stickel et al. | |
| 6,420,714 B1 | 7/2002 | Katsap et al. | |
| 7,388,216 B2 * | 6/2008 | Ogasawara | 250/492.22 |
| 2008/0048117 A1 | 2/2008 | Suzuki | |
| 2010/0065753 A1 * | 3/2010 | Enyama et al. | 250/397 |
| 2012/0295202 A1 * | 11/2012 | Sano | 430/296 |
| 2013/0056645 A1 * | 3/2013 | Yoshikawa et al. | 250/396 R |
| 2013/0056647 A1 * | 3/2013 | Yoshikawa et al. | 250/400 |

FOREIGN PATENT DOCUMENTS

| | | |
|---|---|---|
| JP | 1-248617 | 10/1989 |
| JP | 5-251317 | 9/1993 |
| JP | 8-264411 | 10/1996 |
| JP | 2006-261342 | 9/2006 |

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A multi charged particle beam writing apparatus according to one aspect of the present invention includes a first aperture member to form multiple beams, a blanker array provided with a plurality of blankers which respectively perform blanking deflection of a corresponding beam in the multiple beams, a first electromagnetic lens and a second electromagnetic lens arranged between the first aperture member and the blanker array, a second aperture member arranged between the first electromagnetic lens and the second electromagnetic lens and at a position of a convergence point of the multiple beams and configured to restrict passage of charged particles deviated from the convergence point, and a third aperture member to block each beam which was deflected to be in a beam off state by the plurality of blankers.

15 Claims, 14 Drawing Sheets

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from the prior Japanese Patent Application No. 2011-219909 filed on Oct. 4, 2011 in Japan, the entire contents of which are incorporated herein by reference.

BACKGROUND OF THE INVENTION

1. Field of the Invention

The present invention relates to a multi charged particle beam writing apparatus and a multi charged particle beam writing method.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with electron beams.

For example, there is a writing apparatus using multiple beams (multi-beams). Since it is possible for a multi-beam writing apparatus to perform irradiation with many beams at one time, throughput can be greatly increased compared with the case of writing using one electron beam.

FIG. 15 shows a part of the structure of a writing apparatus of a multi-beam system. In such a writing apparatus of a multi-beam system, as shown in FIG. 15, multi-beams 502 are formed by letting an electron beam 500 emitted from an electron gun assembly 501 pass through a mask (multi-beam forming aperture) 510 having a plurality of holes, for example. Each of the formed multiple beams is blanking-controlled by a blanking deflection electrode array (blanker array) 512 arranged close to the mask 510, and each of beams at the downstream side, which is not blocked by the aperture, is reduced by an optical system and deflected by a deflector so as to be irradiated on a desired position on a target object or "sample" (refer to, e.g., Japanese Patent Application Laid-open (JP-A) No. 2006-261342).

Conventionally, in such a writing apparatus of a multi-beam system, a mask (multi-beam forming aperture) with a plurality of holes for forming multiple beams and a blanking deflection electrode array (blanker array) for respectively performing blanking control of each beam are closely arranged. Therefore, there is a problem in that electrons scattered by the multi-beam forming aperture flow into the blanking deflection electrode array, and then make an insulator portion charged or promote contamination 520.

BRIEF SUMMARY OF THE INVENTION

In accordance with one aspect of the present invention, a multi charged particle beam writing apparatus includes an emission unit configured to emit a charged particle beam, a first aperture member in which a plurality of openings are formed and which is configured to form multiple beams by letting a region including a whole of the plurality of openings be irradiated by the charged particle beam and letting parts of the charged particle beam pass through a corresponding opening of the plurality of openings respectively, a blanker array configured to be provided with a plurality of blankers which perform blanking deflection of a corresponding beam respectively in multiple beams having passed through the plurality of openings of the first aperture member, a first electromagnetic lens and a second electromagnetic lens arranged between the first aperture member and the blanker array, a second aperture member arranged between the first electromagnetic lens and the second electromagnetic lens and at a position of a convergence point of the multiple beams, and configured to restrict passage of charged particles deviated from the convergence point; and a third aperture member configured to block each beam of the multiple beams which was deflected to be in a beam off state by the plurality of blankers.

In accordance with another aspect of the present invention, a multi charged particle beam writing method includes emitting a charged particle beam, forming multiple beams, by using a first aperture member in which a plurality of openings are formed, by letting a region including a whole of the plurality of openings be irradiated by the charged particle beam and letting parts of the charged particle beam pass through a corresponding opening of the plurality of openings respectively, converging multiple beams which have passed through the first aperture member, before performing blanking deflection of the multiple beams, restricting passage of charged particles deviated from a convergence point by using a second aperture member, after converging the multiple beams which have passed through the first aperture member and before performing blanking deflection of the multiple beams, projecting multiple beams which have passed through the second aperture member, on a blanker array having a plurality of blankers, performing blanking deflection of each corresponding beam in the multiple beams projected on the blanker array, by using the plurality of blankers, blocking each beam which was deflected to be in a beam-off state by the plurality of blankers, by using a third aperture member, and writing a pattern on a target object by using multiple beams which have passed through the third aperture member.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used.

There will be described an apparatus and a method capable of inhibiting charge of a blanking deflector array and promotion of contamination caused by charged particles scattered by a multi-beam forming aperture.

Embodiment 1

Figure 1:
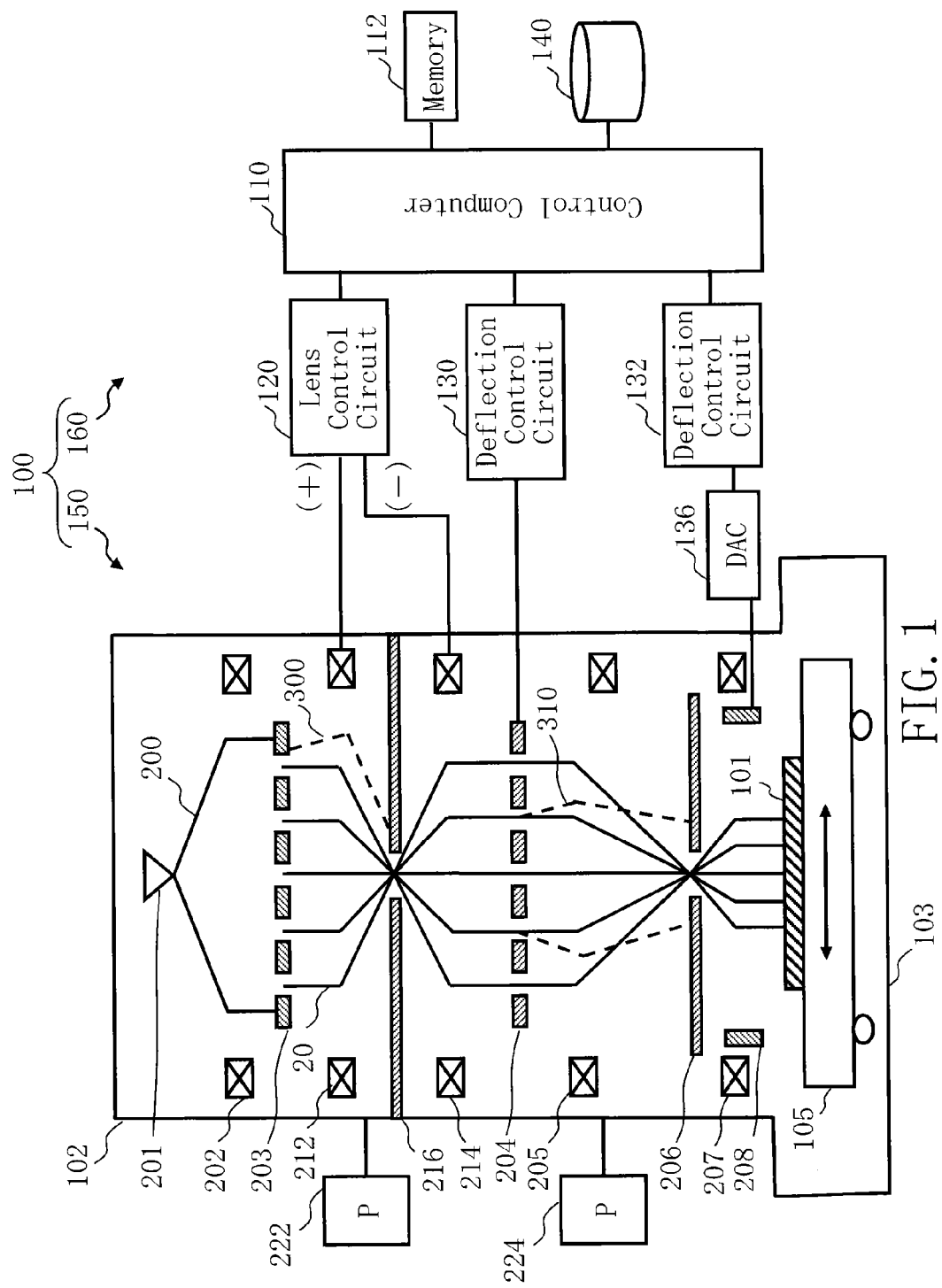
FIG. 1 is a schematic diagram showing the configuration of a writing apparatus according to Embodiment 1.

FIG. 1 is a schematic diagram showing a configuration of a writing apparatus according to Embodiment 1. In FIG. 1, a writing apparatus 100 includes a writing unit 150 and a control unit 160. The writing apparatus 100 is an example of a multi charged particle beam writing apparatus. The writing unit 150 includes an electron lens barrel 102 and a writing chamber 103.

In the electron lens barrel 102, there are arranged an electron gun assembly 201, an illumination lens 202, a multi-beam forming aperture member 203, an electromagnetic lens 212 (or "electron lens"), a limiting aperture member 216, an electromagnetic lens 214 (or "electron lens"), a blanking plate (blanker array) 204, an electromagnetic lens 205 (or "electron lens"), a limiting aperture member 206, an objective lens 207, and a deflector 208. The electromagnetic lenses 212 and 214 are arranged between the multi-beam forming aperture member 203 and the blanking plate 204.

By the electromagnetic lenses 212 and 214, an image of the multi-beam forming aperture member 203 is focused at the deflection center or its vicinity of the blanking plate (blanker array) 204. This aims at inhibiting movement of a reduced image of the multi-beam on the target object when the blanking plate is driven.

Moreover, the limiting aperture member 216 is arranged between the electromagnetic lenses 212 and 214 and at the position of the convergence point of multiple beams converged by the electromagnetic lens 212. An opening is formed at the center of the limiting aperture member 216, and the limiting aperture member 216 restricts passage of beams deviated from the convergence point, for example. The limiting aperture member 216 is used as a differential pumping member which separates the vacuum chamber at the beam upstream side and the vacuum chamber at the beam downstream side. The portion above the limiting aperture member 216, that is the upstream side, in the electron lens barrel 102 is vacuumed by a vacuum pump 222, and the portion below the limiting aperture member 216, that is the downstream side, in the electron lens barrel 102 is vacuumed by a vacuum pump 224.

In the writing chamber 103, there is arranged an XY stage 105, on which a target object or "sample" 101 such as a mask serving as a writing target substrate is placed when writing is performed. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed.

The controlling unit 160 includes a control computer 110, a memory 112, a storage device 140 such as a magnetic disk drive, a lens control circuit 120, deflection control circuits 130 and 132, and a digital-to-analog converter (DAC) amplifier 136. The control computer 110, the memory 112, the storage device 140, the lens control circuit 120, and the deflection control circuits 130 and 132 are mutually connected through a bus (not shown). Writing data is input into the storage device 140 (storage unit) from the outside to be stored therein. The lens control circuit 120 and the deflection control circuits 130 and 132 are controlled by the control calculator 110.

As described above, FIG. 1 shows a structure necessary for explaining Embodiment 1. Other structure elements generally necessary for the writing apparatus 100 may also be included.

Figure 2A:
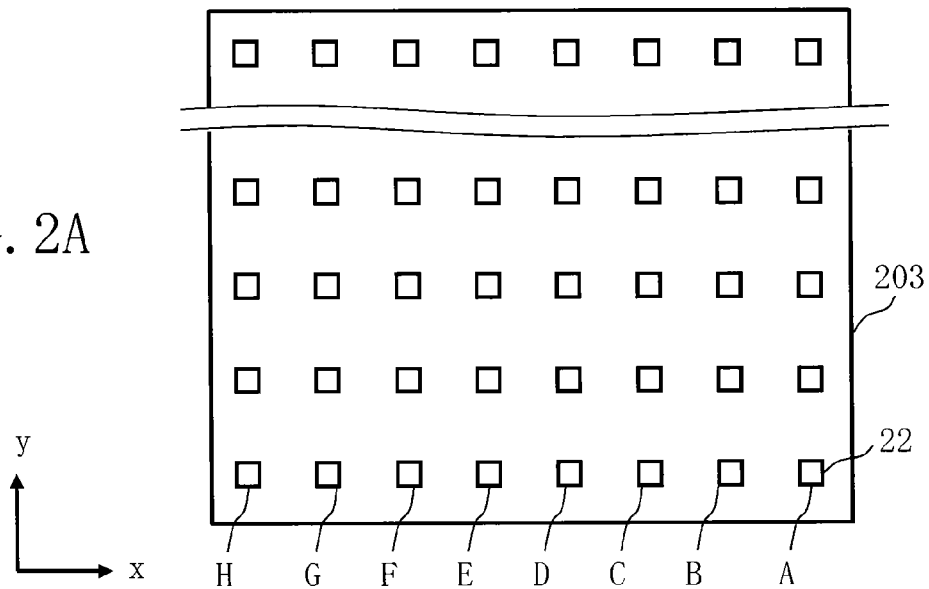
FIGS. 2A and 2B are schematic diagrams showing structures of an aperture member according to Embodiment 1.
Figure 2B:
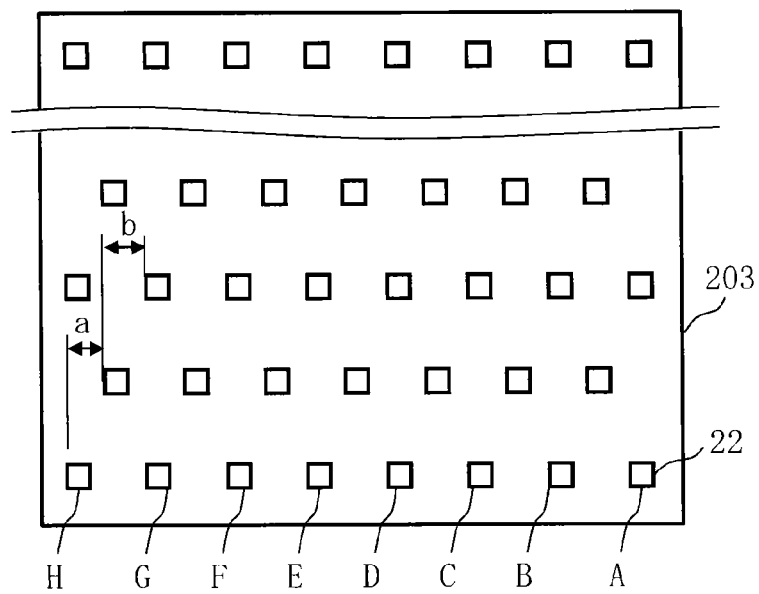

FIGS. 2A and 2B are schematic diagrams showing structures of an aperture member according to Embodiment 1. In FIG. 2A, a plurality of holes (openings) 22 are formed at a predetermined arrangement pitch in the multi-beam forming aperture member 203, wherein m×n (m≧=2, n≧=2) holes are in m columns in the vertical direction (y direction) and in n rows in the horizontal direction (x direction). In FIG. 2A, 512×8 (8 columns) holes 22 are formed, for example. Each hole 22 has the same dimensional shape of a quadrangle, such as a rectangle or a square. Alternatively, each hole may be a circle of the same circumference. In this case, there is shown an example of each row having eight holes 22 from A to H in the x direction. Multi-beams 20 are formed by letting parts of an electron beam 200 pass through a corresponding hole of a plurality of holes 22 respectively. Here, there is shown the case where the holes 22 are arranged in two or more columns and rows, namely in both the x and y directions, but it is not limited thereto. For example, it is also acceptable to arrange a plurality of holes 22 in only one row or in only one column, namely in one row and a plurality of columns, or in one column and a plurality of rows. Moreover, the method of arranging the holes 22 is not limited to the case of FIG. 2A where holes are arranged in a grid. It is also preferable to arrange the holes 22 as shown in FIG. 2B where each hole in the second row is shifted from the position of each hole in the first row by the length "a" in the horizontal direction (x direction). Similarly, it is also preferable to arrange the holes 22 such that each hole in the third row is shifted from the position of each hole in the second row by the length "b" in the horizontal direction (x direction).

Figure 3:
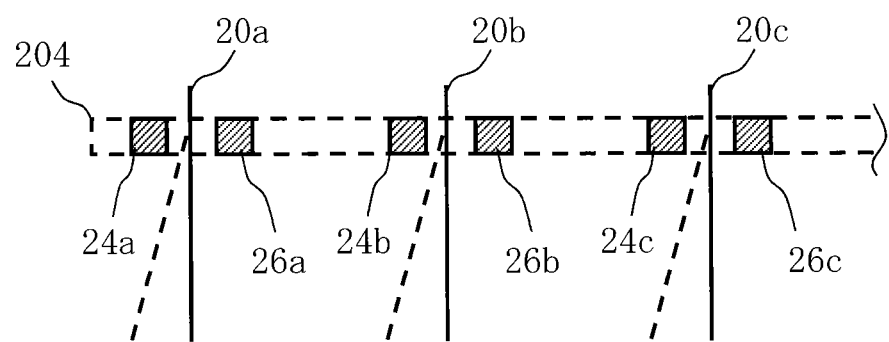
FIG. 3 is a schematic diagram showing the structure of a blanking plate according to Embodiment 1.

FIG. 3 is a schematic diagram showing a structure of the blanking plate according to Embodiment 1. In the blanking plate (also called a "blanker array", "blanking deflection electrode array" or "blanking deflector array") 204, a passage hole is formed to be corresponding to the arrangement position of each hole 22 of the multi-beam forming aperture member 203, and a pair of electrodes (blankers) 24 and 26 is arranged for each passage hole. Thus, a plurality of blankers for respectively performing blanking deflection of corresponding beam are arranged in the blanking plate (blanker array) 204. The electron beam 20 passing through each passage hole is deflected by the voltage applied to two electrodes 24 and 26 being a respective pair, and blanking control is performed by this deflection. Thus, a plurality of blankers respectively perform blanking deflection of a corresponding beam in multiple beams having passed through a plurality of holes 22 (openings) of the aperture member 203.

Figure 4:
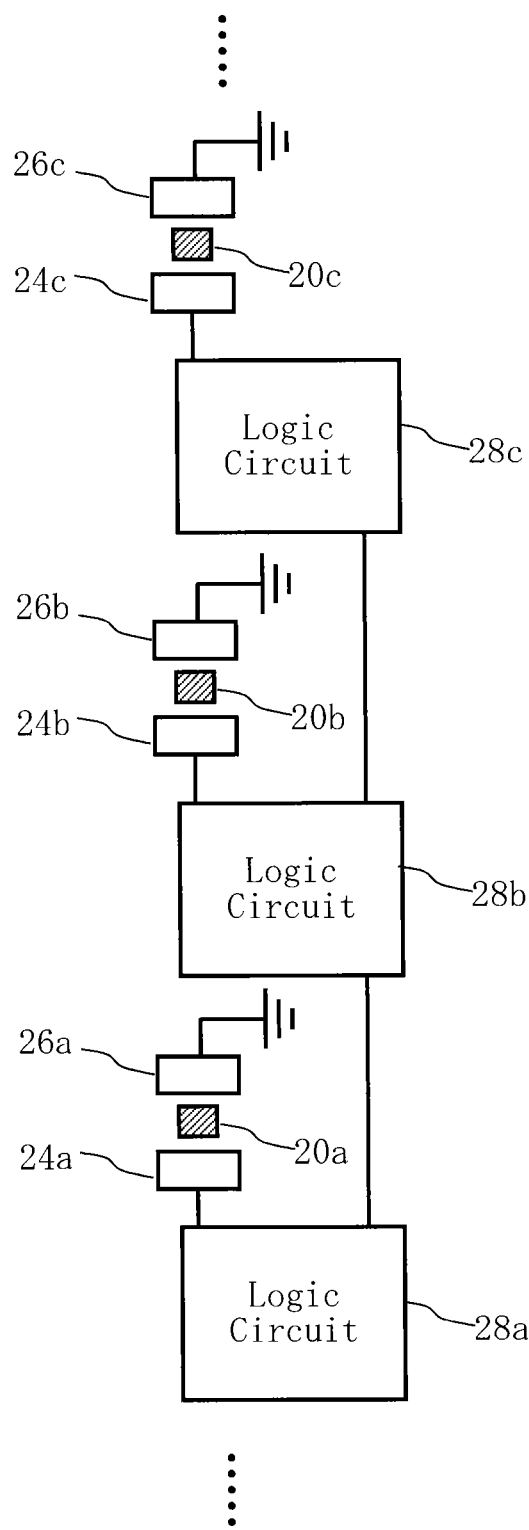
FIG. 4 is a top view schematic diagram showing a structure of the blanking plate according to Embodiment 1.

FIG. 4 is a top view schematic diagram partly showing a structure of the blanking plate according to Embodiment 1. In the blanking plate 204, a logic circuit 28 for controlling a pair of electrodes 24 and 26 is arranged. Blanking deflection is performed by the control of the logic circuit 28.

The electron beam 200 emitted from the electron gun assembly 201 (emission unit) almost perpendicularly illuminates the whole of the multi-beam forming aperture member 203 (first aperture member) by the illumination lens 202. A plurality of holes (openings) of a rectangle, for example, are formed in the multi-beam forming aperture member 203. The region including a plurality of holes (openings) 22 of the multi-beam forming aperture member 203 is irradiated by the electron beam 200, and the multi-beams 20 are formed by letting parts of the electron beam 200 pass through a corresponding hole of a plurality of holes (openings) 22 respectively. For example, a plurality of rectangular electron beams (multi-beams) 20a, b, c, . . . , are formed by letting parts of the electron beam pass through a plurality of holes 22 of the multi-beam forming aperture member 203 respectively. The multi-beams 20 are converged by the electromagnetic lens 212, and passage of a scattered electron 300 deviated from the convergence point is restricted by the limiting aperture member 216 (second aperture member) arranged at the convergence position. Thereby, electrons scattered by the multi-beam forming aperture member 203 are blocked. Therefore, it is possible to prevent the scattered electrons from entering the blanking plate 204 at the downstream side. Then, the multi-beams 20 whose scattered electron was blocked by the limiting aperture member 216 is almost perpendicularly projected on the blanking plate 204 by the electromagnetic lens 214.

Here, the electromagnetic lenses 212 and 214 are oppositely excited by the same amount of current (or "energy") by the lens control circuit 120. Thereby, it is possible to avoid that the multiple beams having passed through the electromagnetic lens 212 rotate when they pass through the electromagnetic lens 214. The lens control circuit 120 is an example of a lens control unit.

Then, the multi-beams 20, whose scattered electrons were blocked, respectively pass through a corresponding blanker of the blanking plate 204. A control signal controlled by the deflection control circuit 130 is output to the logic circuit 28 for each blanker of the blanking plate 204, and each blanker is controlled by the logic circuit 28 respectively so as to deflect the electron beam 20 which passes separately. The multi-beams 20a, b, c, having passed through the blanking plate 204 are converged by the electromagnetic lens 205, and go toward the hole at the center of the limiting aperture member 206. Here, the electron beam 310 which was deflected by the blanker of the blanking plate 204 deviates from the hole of the center of the limiting aperture member 206 (third aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in a beam-off state by a plurality of blankers.

Then, one-shot beams are formed by beams which have been formed during from the beam-on state to the beam-off state and have passed through the limiting aperture member 206. The multi-beams 20 having passed through the limiting aperture member 206 are focused by the objective lens 207. Then, respective beams (the entire multi-beams 20) having passed through the limiting aperture member 206 are collectively deflected in the same direction by the deflector 208, and irradiate respective irradiation positions on the target object 101. While the XY stage 105 is continuously moving, controlling is performed by the deflector 208 such that the irradiation position of the beam follows the movement of the XY stage 105, for example. Ideally, one-time irradiation of the multi-beams 20 is aligned at pitches obtained by multiplying the arrangement pitch of a plurality of holes of the aperture member 203 by a desired reduction rate described above. The writing apparatus 100 performs a writing operation by the raster scan method which continuously irradiates shot beams in order, and when writing a desired pattern, an unnecessary beam is controlled to be beam-off by the blanking control.

Figure 5:
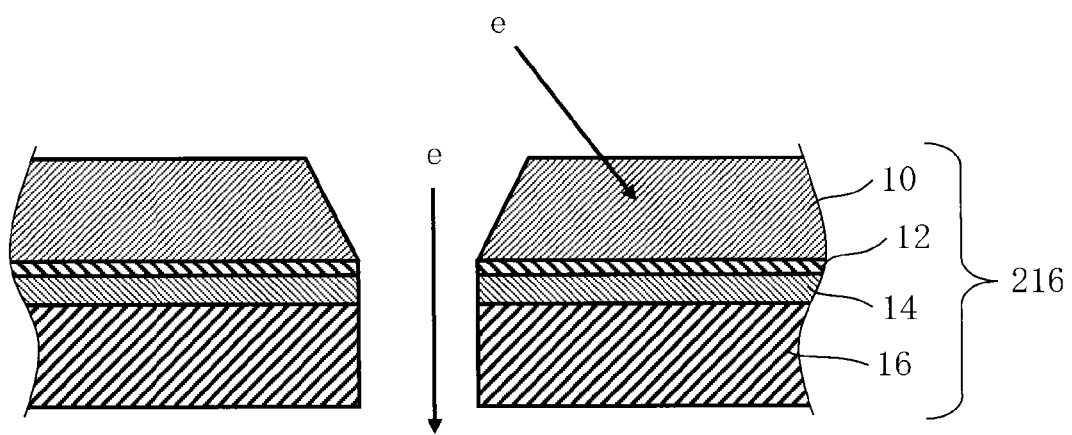
FIG. 5 is a cross-sectional view showing the structure of a limiting aperture member for blocking scattered electrons according to Embodiment 1.

FIG. 5 is a cross-sectional view showing the structure of a limiting aperture member for blocking scattered electrons according to Embodiment 1. The limiting aperture member 216 is formed of a laminated structure of a first member 10, a second member 12, a third member 14, and a fourth member 16 from the upper layer side. The first member 10, which is an upper layer member with respect to the incident direction of a beam, is formed of a member whose atomic number is lower than that of the fourth member, which is a lower layer member. Moreover, it is preferable to form the thickness of the first member 10 of the upper layer member to be thicker than the range of an electron. Scattered electrons are blocked by the first member 10. As a member of the first member 10, carbon or diamond-like carbon with given conductivity is suitable, for example. Now, the case of using carbon as an upper layer member, and an electron of 50 keV being incident therein will be described. At this time, $$R(\mu m) = 0.0276 A \times E_0^{1.67} / (\rho \times Z^{0.889})$$

is used as a range R.

In the right-hand side, A indicates an atomic weight of the member, Z indicates an atomic number, $E_0$ indicates an acceleration voltage of kV unit, and p indicates a density (g/cm3), and thus, the right-hand side gives a range of an electron per μm. ("Handbook of Charged Particle Optics", edited by Jon Orloff: 1997, CRC Press, p. 377) Assuming that A=12, Z=6, and ρ=2.25 g/cm3, it becomes R=20.5 μm. Moreover, an X-ray generated by the multi-beam forming aperture member 203 is blocked by the fourth member 16. It is preferable for the material of the fourth member 16 to be, for example, tungsten (W), etc. Further, it is preferable for the thickness of the fourth member 16 to be thick enough for blocking an X-ray. The shape dimension of the opening of the aperture is highly accurately processed by the third member 14. Therefore, the opening of the first member 10 is formed to be a little larger than that of the third member 14. Moreover, it is preferable for the opening of the first member 10 to be formed in the shape of a taper which becomes narrower downward. The dimension of the minimum diameter is formed to be a little larger than the opening of the third member 14. It is preferable for the material of the third member 14 to be silicon (Si), etc., for example. Moreover, the adhesion of the first member 10 and the third member 14 is increased by the second member 12. It is preferable for the material of the second member 12 to be SiC, for example. Although the member composed of the four layers is structured as an example in this case, it is not limited thereto. For example, it may be structured of two layers of the first member 10 and the fourth member 16. Scattered electrons and X-rays can be blocked by the two layers.

In the case where the multi-beam forming aperture member and the blanking plate are arranged closely like a conventional multi-beam writing apparatus, an X-ray is generated in addition to the scattered electrons produced by the multi-beam forming aperture member. There occurs a problem in that a logic circuit in the blanking plate will be damaged if the X-ray enters the blanking plate. According to Embodiment 1, since the X-ray generated by the multi-beam forming aperture member 203 can be blocked by the limiting aperture member 216, it is possible to prevent the X-ray from entering the blanking plate 204. Accordingly, damage of the logic circuit 28 in the blanking plate 204 can be avoided.

Moreover, according to Embodiment 1, the limiting aperture member 216 is used as a differential pumping member, which separates the vacuum chamber at the beam upstream side and the vacuum chamber at the beam downstream side. Then, promotion of contamination generated by the multi-beam forming aperture member 203 can be inhibited by keeping the upper portion (upstream side) above the limiting aperture member 216 in the separated electron lens barrel 102 to be highly vacuum.

Furthermore, for inhibiting promotion of contamination, it is also effective to provide a heating means (not shown) at the surrounding part or at the holding part of the multi-beam forming aperture member 203 in order to keep the temperature of the multi-beam forming aperture member 203 at 150 degrees C. or more. Resistance heating can be used as the heating means. Here, it is preferable to regulate the flow of the current so that the magnetic field generated by the current flowing through the resistance may not affect an electron beam track. For example, when using a nichrome wire as the resistance for heating, it is effective for the nichrome wire to have a stranded wire structure with a copper wire which is insulated electrically and in which a return current flows. At this time, the temperature of the limiting aperture member 216 is kept to be constant by being connected to the main part of the lens barrel whose temperature is controlled to be constant in the normal temperature. Thereby, the limiting aperture member 216 also functions as a heat-shield. By the method described above, it is possible to inhibit a heat flow by heat radiation from the multi-beam molding aperture 203 to the blanking plate 204.

As mentioned above, by arranging the electromagnetic lenses 212 and 214 between the multi-beam forming aperture member 203 and the blanking plate 204, and arranging the limiting aperture member 216 between the electromagnetic lenses 212 and 214, it is possible to prevent scattered electrons from entering the blanking plate 204. Accordingly, charging of the blanking plate 204 and promoting contamination can be inhibited. As a result, the life of the writing apparatus can be improved.

Figure 6A:
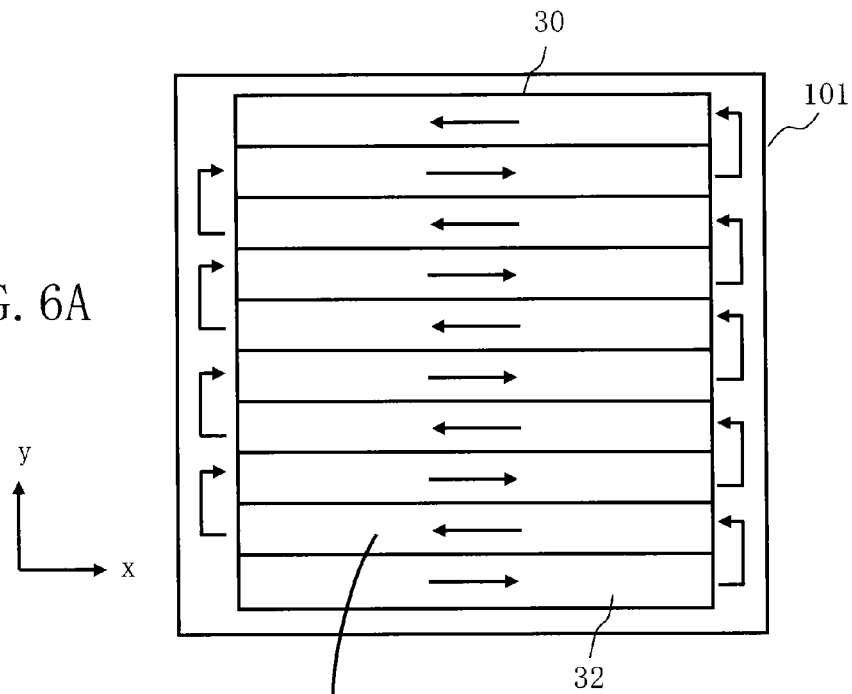
FIGS. 6A to 6C are schematic diagrams for explaining a writing operation according to Embodiment 1.
Figure 6B:
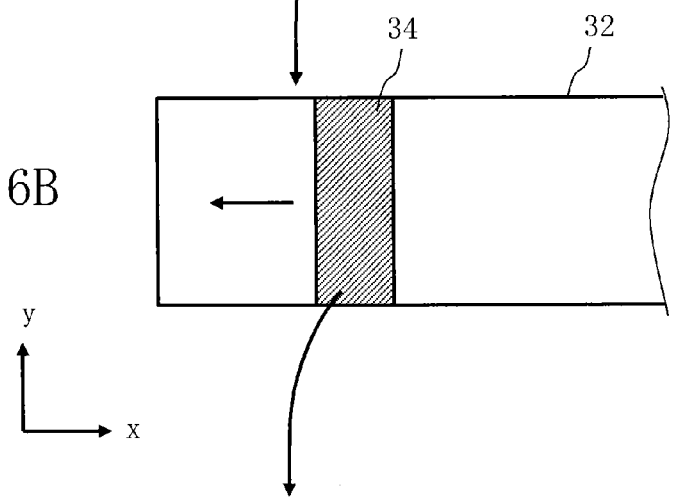
Figure 6C:
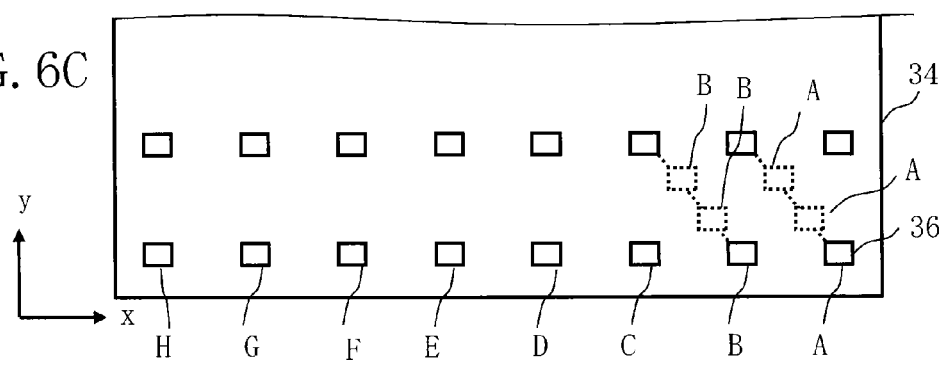

FIGS. 6A to 6C are schematic diagrams for explaining a writing operation according to Embodiment 1. As shown in FIG. 6A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34, which can be irradiated by one time irradiation of the multi-beam 20, is located at the left end of the first stripe region 32 or at the further left position, and then writing is started. When writing the first stripe region 32, writing advances relatively in the x direction by moving the XY stage 105 in the −x direction, for example. The XY stage 105 is continuously moved at a predetermined rate of speed, for example. After writing the first stripe region 32, the stage position is moved in the −y direction and adjusted such that the irradiation region 34 is located, to be relatively in the y direction, at the right end of the second stripe region 32 or at the further right position. Then, similarly, as shown in FIG. 6B, writing advances in the −x direction by moving the XY stage 105 in the x direction, for example. Writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. When writing each stripe 32 and while the XY stage 105 is moving in the x direction, the writing is executed by a raster scan method in which the deflector 208 performs deflection such that each shot moves (scans) in the y direction in order and shot beams deliver radiation continuously in order. For example, if the ratio of the movement speed in the x direction and the scan speed in the y direction is 1:1, as shown in FIG. 6C, a shot pattern 36 formed by a beam having passed through one hole A of the aperture member 203 is to be irradiated being deviated from the first irradiated position, from the y direction to the −x direction, in order by 45 degrees (in a direction of 135 degrees). Similarly, the shot pattern 36 formed by a beam having passed through one hole B of the aperture member 203 is to be irradiated being deviated from the first irradiated position, from the y direction to the −x direction, in order by 45 degrees. Similarly, the shot pattern 36 formed by each of beams having passed through the holes C to H of the aperture member 203 is respectively to be irradiated being deviated from the first irradiated position, from the y direction to the −x direction, in order by 45 degrees. Thus, the inside of each region surrounded by beams of 2 by 2 in height and width irradiated by one time irradiation (one shot) is to be written by the raster scan method. Each of the region surrounded by beams of 2 by 2 includes two beam positions located side by side in the lower side of the region surrounded by beams of 2 by 2 in Fig. C, and other two beam positions in the upper side of the region surrounded by beams of 2 by 2 are included by another region which is one step upper in the y direction than the region concerned.

Figure 7:
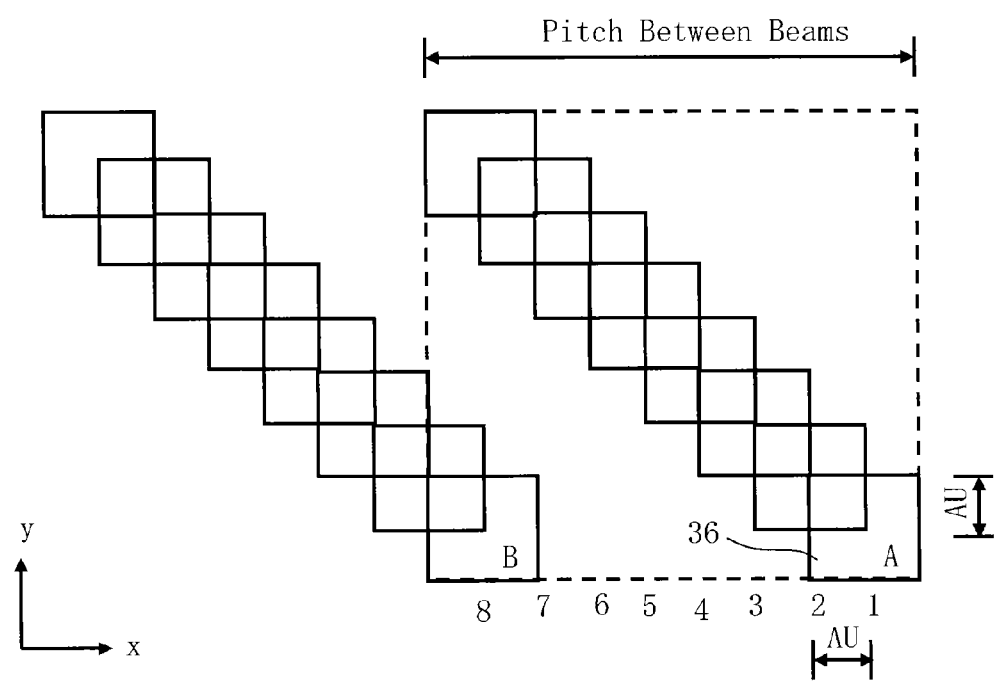
FIG. 7 is a schematic diagram for explaining a writing operation of raster scanning according to Embodiment 1.

FIG. 7 is a schematic diagram for explaining a writing operation of raster scanning according to Embodiment 1. For example, in the case there are eight holes A to H formed in the x direction in the aperture member 203, each region surrounded by a beam of 2 by 2 irradiated by one time irradiation is irradiated by beams of a plurality of shot times while the stage moves between the shot patterns 36 located side by side in the x direction and irradiated by one time irradiation. For example, it is set such that control grids (AUs), each having a predetermined quantization size and arranged in a grid shape, are to be nAU×nAU in each region surrounded by a beam of 2 by 2 irradiated by one time irradiation. While the stage is moving, each region surrounded by a beam of 2 by 2 is irradiated by beam shots of n times at intervals of a control grid (AU). In this case, each region surrounded by an ideal beam of 2 by 2 irradiated by one time irradiation is set to be a size of eight AUs×eight AUs, and while the stage is moving, each region surrounded by the beam of 2 by 2 is shot per AU and irradiated by beam shots of eight times. In FIG. 7, AU is a shot interval of a shot pattern, and, in other words, indicates a distance between centers of respective shots. Each of the numbers 1 to 8 in FIG. 7 indicates a shot of the first time, a shot of the second time, and so on. Each number in FIG. 7 is located at every center position of the shot pattern 36. Therefore, each distance between numbers serves as an AU.

For example, the eighth time shot by the hole A irradiates a position deviated by eight AUs in the y direction from the first time shot by the adjacent hole B. When shooting each AU, it is desirable for increasing pattern accuracy to perform radiation such that the shot patterns 36 formed by beams having passed through one hole A of the aperture member 203 overlap each other in the x and y directions. In this case, a beam size is set to be twice the AU, for example. Then, therefore, radiation is performed so that each shot pattern 36 may overlap each other by ½ in the x and y directions, respectively.

Figure 8:
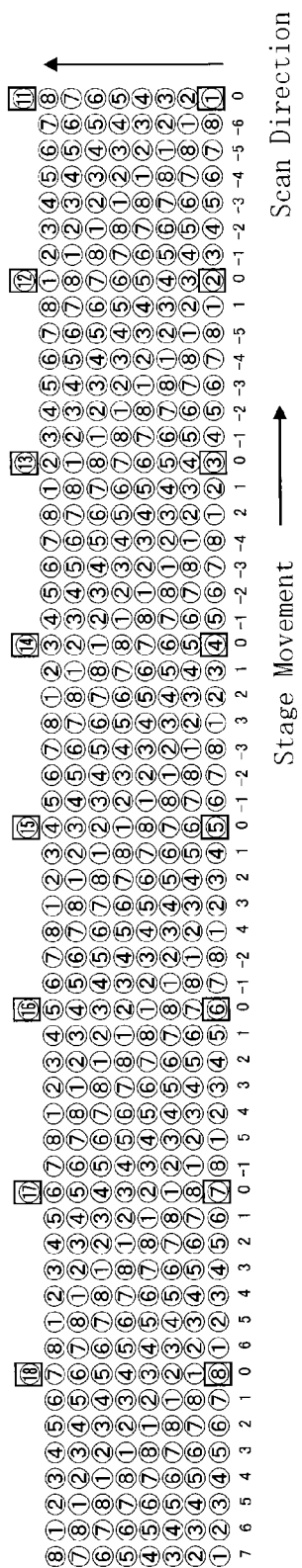
FIG. 8 is a schematic diagram for explaining in detail about an example of the irradiation position of each shot in the case of the stage being moved n times the length of the pitch between beams according to Embodiment 1.

FIG. 8 is a schematic diagram for explaining in detail about an example of the irradiation position of each shot in the case of the stage being moved n times the length of the pitch between beams according to Embodiment 1. In FIG. 8, the number "1" surrounded by a circle indicates a position shot by a beam having passed through the hole A of the aperture member 203. The number "2" surrounded by a circle indicates a position shot by a beam having passed through the hole B of the aperture member 203. The number "3" surrounded by a circle indicates a position shot by a beam having passed through the hole C of the aperture member 203. The number "4" surrounded by a circle indicates a position shot by a beam having passed through the hole D of the aperture member 203. The number "5" surrounded by a circle indicates a position shot by a beam having passed through the hole E of the aperture member 203. The number "6" surrounded by a circle indicates a position shot by a beam having passed through the hole F of the aperture member 203. The number "7" surrounded by a circle indicates a position shot by a beam having passed through the hole G of the aperture member 203. The number "8" surrounded by a circle indicates a position shot by a beam having passed through the hole H of the aperture member 203.

Moreover, "11" to "18" respectively indicate other holes located at one step upper in the y direction than the holes A to H of the aperture member 203. The position surrounded by a square indicates a position of each of the holes A to H of the aperture member 203. Shot patterns 36 formed by beams respectively having passed through the holes A to H of the aperture member 203 are away from each other ideally by a pitch between beams.

If the stage is moved n times (in this case, 8 times) the length of the pitch between beams while performing shooting n times (in this case, 8 times) at intervals of AU (control grid) as the pitch between beams, the inside of each region surrounded by a beam of 2 by 2 irradiated by one time irradiation is to be filled with each shot pattern 36 formed by each beam having passed through the holes A to H of the aperture member 203 respectively as shown in FIG. 8. If making beams of unnecessary shots off in the shots described above, In accordance with the shape of a pattern to be written, it is possible to write a pattern of a desired shape on the target object 101 by connecting remaining shot patterns 36.

In FIG. 8, controlling is performed such that the stage is moved in the +x direction and the whole of the beams are scanned in the y direction orthogonal to the +x direction. This state is conceptually shown with an arrow in the right-hand side of FIG. 8. Moreover, the timing of starting scanning is denoted by T=−6 to T=7 on the basis of T=0, at the position under the opening (hole) position of the aperture. FIGS. 6A to 6C show typical writing positions where each beam starts scanning when T=0. In this example, by performing y-scan to be in accordance with the stage movement in the +x direction, the whole surface is to be filled with beam shots while the writing position relatively moves in the −x direction. After the 0-th scanning in the y direction at T=0, the beam position is at a place shifted by one AU (in the −x direction) from the position irradiated by the adjoining beam, and then, the first (T=1) scanning starts from this position. The stage movement speed is controlled such that the beam position is to be at a place shifted by one AU (to the −x direction) from the position irradiated by the adjoining beam when the first y-scan has finished. Writing is similarly performed with respect to the upper and lower beams in the y direction, and a beam shot is irradiated such that the whole surface is to be filled per AU. Various patterns can be written depending on a dose amount of each beam shot.

Figure 9:
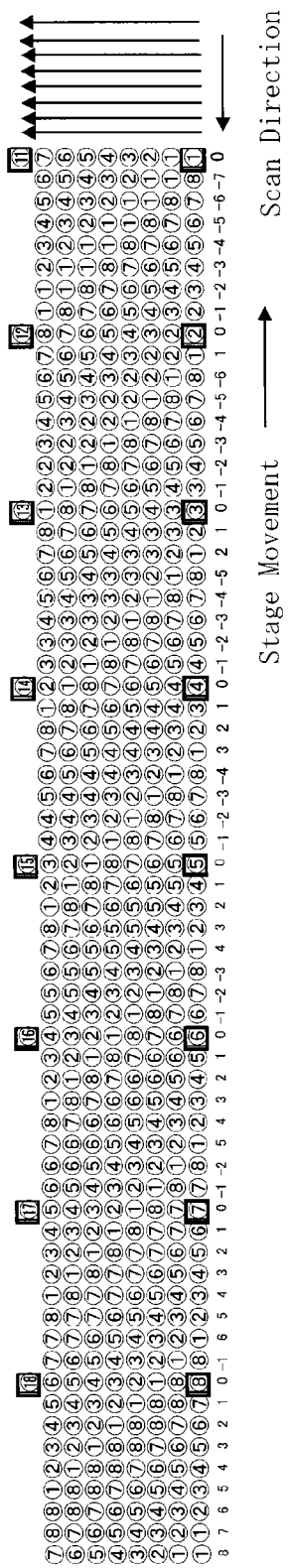
FIG. 9 is a schematic diagram for explaining in detail about another example of the irradiation position of each shot in the case of the stage being moved n times the length of the pitch between beams according to Embodiment 1.

FIG. 9 is a schematic diagram for explaining in detail about another example of the irradiation position of each shot in the case of the stage being moved n times the length of the pitch between beams according to Embodiment 1. In FIG. 9, the relation between the number surrounded by a circle and the position of each hole of the aperture member 203 is the same as that of FIG. 8. Moreover, "11" to "18" respectively indicate other holes located at one step upper in the y direction than the holes A to H of the aperture member 203. The position surrounded by a square indicates the position of each of the holes A to H of the aperture member 203. FIG. 9 shows a modified example of FIG. 8. In this modified example of FIG. 9, scanning in the x direction is added to the example of FIG. 8. In FIG. 9, when the 0-th (T=0) y-scan is completed, the origin position (scan starting position) accords with the 0-th (T=0) scanning starting position of the beam having passed through the left-hand side hole. In other words, the stage speed is controlled to be in such a state described above. The y-scan is started by shifting the first (T=1) scanning starting position to the left (in the −X direction) by one control unit (one AU) (that is performing x-scan) in order not to overlap with the writing position of the beam of the left hole. Such processing is to be repeated in order. When the scanning at the time of T=7 is finished, the amount of deflection in the x direction is returned to 0, and then, the same processing is repeated again.

Figure 10:
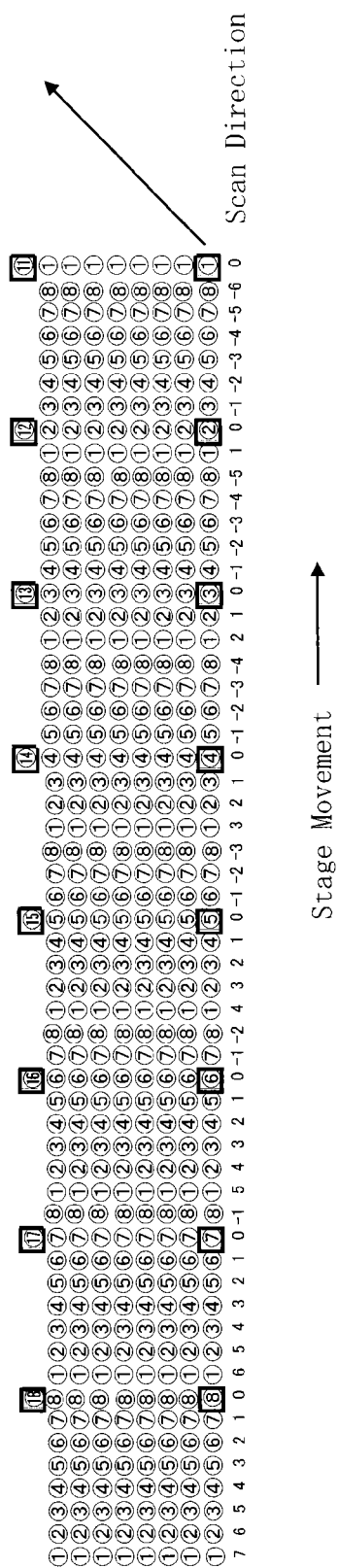
FIG. 10 is a schematic diagram for explaining in detail about another example of the irradiation position of each shot in the case of the stage being moved n times the length of the pitch between beams according to Embodiment 1.

FIG. 10 is a schematic diagram for explaining in detail about another example of the irradiation position of each shot in the case of the stage being moved n times the length of the pitch between beams according to Embodiment 1. FIG. 10 shows a further modified example of FIG. 8. In FIG. 10, the relation between the number surrounded by a circle and the position of each hole of the aperture member 203 is the same as that of FIG. 8. Moreover, "11" to "18" respectively indicate other holes located at one step upper in the y direction than the holes A to H of the aperture member 203. The position surrounded by a square indicates the position of each of the holes A to H of the aperture member 203. In the example of FIG. 10, y-scan is performed in about 45-degree direction while following the stage movement. As a result, as shown in FIG. 10, the irradiation position by the y-scan does not move in the x direction and writing is to be performed in the +y direction. The stage movement speed is controlled such that the beam position is to be at a place shifted by one AU (in the −x direction) from the position irradiated by the adjoining beam when y-scan of one time finishes. By performing writing as described above, writing positions whose irradiation positions of respective beams are aligned in x and y can be obtained.

Figure 11:
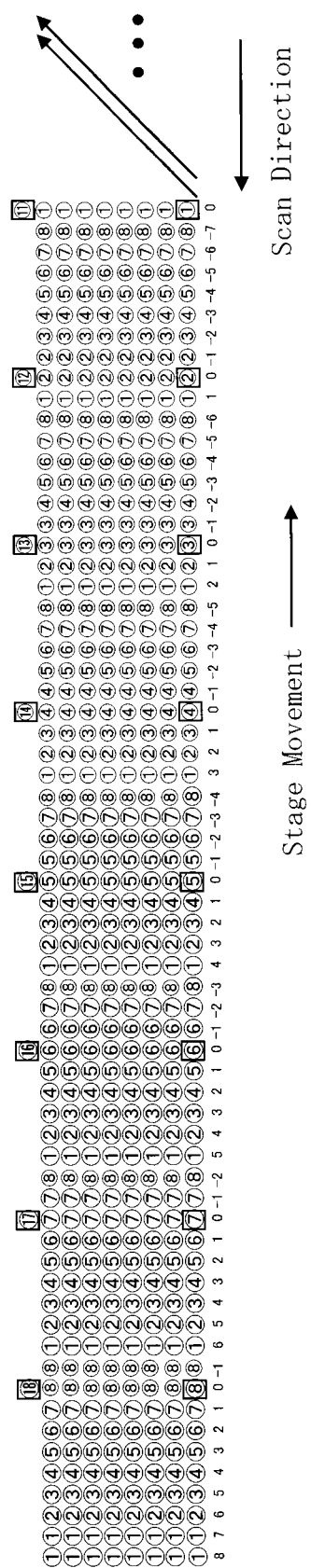
FIG. 11 is a schematic diagram for explaining in detail about another example of the irradiation position of each shot in the case of the stage being moved n times the length of the pitch between beams according to Embodiment 1.

FIG. 11 is a schematic diagram for explaining in detail about another example of the irradiation position of each shot in the case of the stage being moved n times the length of the pitch between beams according to Embodiment 1. FIG. 11 shows a further modified example of FIG. 8. In FIG. 11, the relation between the number surrounded by a circle and the position of each hole of the aperture member 203 is the same as that of FIG. 8. Moreover, "11" to "18" respectively indicate other holes located at one step upper in the y direction than the holes A to H of the aperture member 203. The position surrounded by a square indicates the position of each of the holes A to H of the aperture member 203. In FIG. 11, scanning in the x direction is added to the example of FIG. 10. Wile performing the y direction scan, when the writing position is controlled in order so as to move in x direction to follow the stage speed, the writing position to be written will be moved in order in the y direction position. When the y-scan following the 0-th (T=0) stage movement is completed in the example of FIG. 11, the origin position (scan starting position) accords with the starting position of the 0-th (T=0) scanning of the beam having passed through the left-hand side hole. In other words, the stage speed is controlled to be in such a state described above. The y-scan following the stage movement is started by shifting the first (T=1) scanning starting position to the left (in the −x direction) by one control unit (one AU) by performing x-scan in order not to overlap with the writing position of the beam of the left hole. Such processing is to be repeated in order. When the scanning at the time of T=7 is finished, the amount of deflection in the x direction is returned to 0, and then the same processing is repeated again. Here, further, if the scanning speed in the y direction is changed, the shot interval in the y direction can be changed, for example.

As FIGS. 8 to 11 have shown examples of the irradiation position of each shot, the method of scanning combined with the stage movement can be variously selected. Although the method of writing only by y direction scanning has a merit in that control is simple, flexibility is not sufficient because there is no x direction scanning. By contrast, the method where x and y directions scanning are combined has a merit in that there are more selections. For example, by changing the scan method as shown in the examples of FIGS. 8 to 11, it is possible to perform writing while changing the number of shots between beams (that is, changing the control unit). These should just be selected according to a design requirement.

As mentioned above, after multiple beams have been formed, the multiple beams having passed through the multi-beam forming aperture member 203 are converged before performing blanking deflection of the multiple beams. Then, before performing blanking deflection of the multiple beams and after the multiple beams having passed through the multi-beam forming aperture member 203 are converged, passage of charged particle beams deviated from the convergence point is restricted by using the limiting aperture member 216. The multiple beams having passed through the limiting aperture member 216 are projected on the blanker array which has a plurality of blankers. Owing to the configuration described above, it is possible to inhibit scattered electrons and X-rays generated due to the multi-beam forming aperture member 203 from entering the blanker array.

According to Embodiment 1, charged particles scattered by the multi-beam forming aperture can be blocked. Therefore, charging of the blanking deflector array and promotion of contamination can be inhibited. As a result, the life of the writing apparatus can be improved.

Embodiment 2

In Embodiment 1, there is described an example in which a passage hole is formed in the blanking plate 204 such that the hole is to be corresponding to the arrangement position of each hole 22 of the multi-beam forming aperture member 203. Thereby, the blanking plate 204 deflects a beam of the same size as that of the multi-beam formed by the multi-beam forming aperture member 203. In Embodiment 2, there will be described an apparatus which can change the size of the multi-beam formed by the multi-beam forming aperture member 203. Hereafter, the contents except for the point particularly described are the same as those of Embodiment 1.

Figure 12:
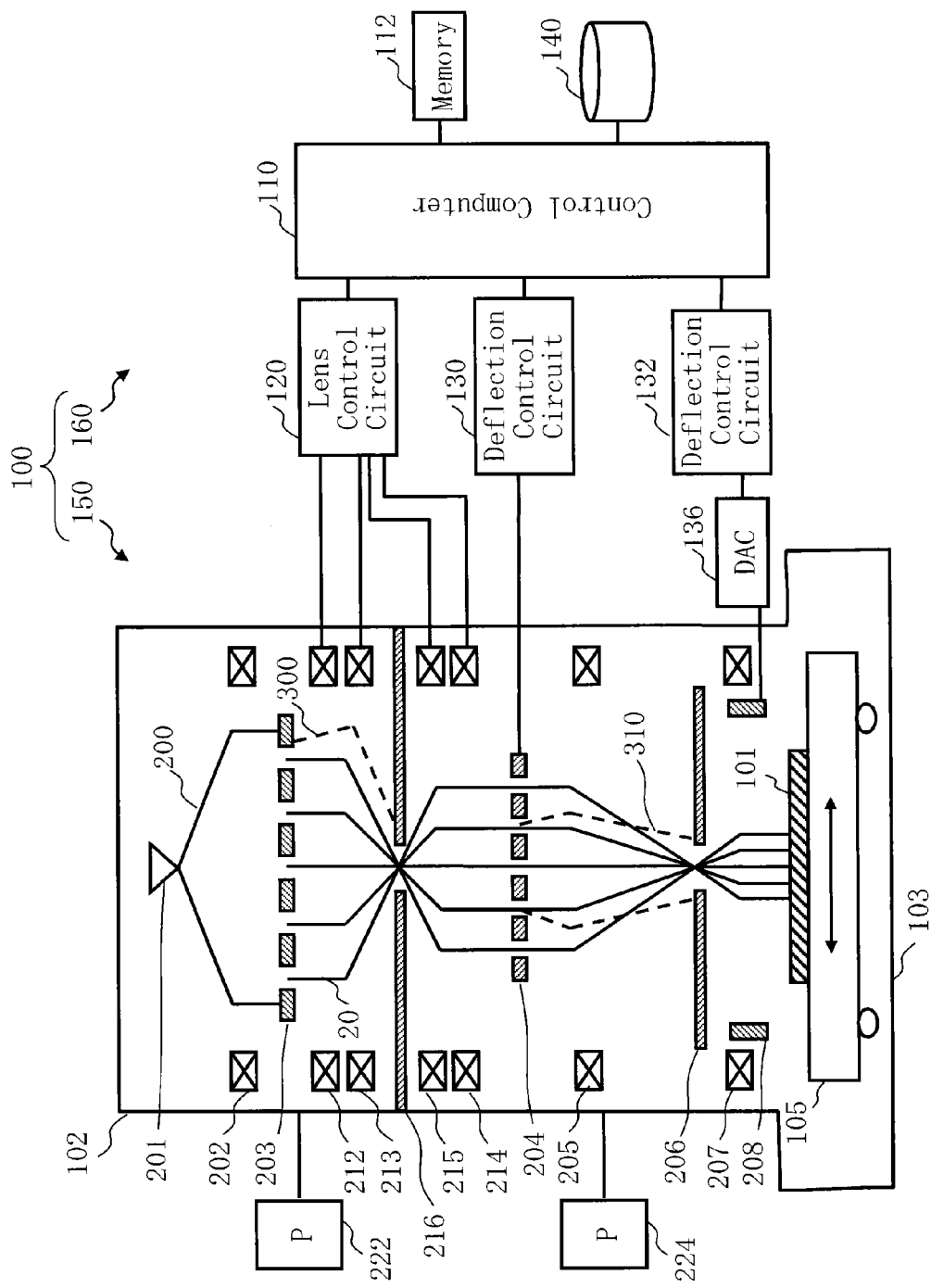
FIG. 12 is a schematic diagram showing a structure of a writing apparatus according to Embodiment 2.

FIG. 12 is a schematic diagram showing the structure of a writing apparatus according to Embodiment 2. FIG. 12 is the same as FIG. 1 except for that a plurality of electromagnetic lenses 212 and 213 (or "electron lenses") are arranged between the multi-beam forming aperture member 203 and the limiting aperture member 216, and a plurality of electromagnetic lenses 215 and 214 (or "electron lenses") are arranged between the limiting aperture member 216 and the blanking plate 204. However, in FIG. 12, the arrangement pitch of passage holes for multiple beams in the blanking plate 204 differs from that of the arrangement position of holes 22 of the multi-beam forming aperture member 203.

Figure 13:
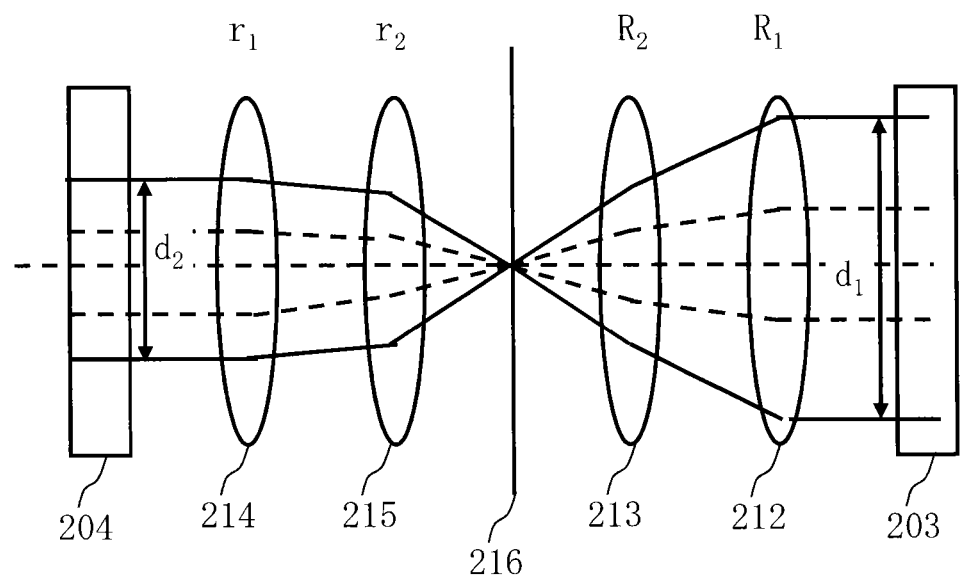
FIG. 13 is a schematic diagram for explaining the size of multiple beams between the multi-beam forming aperture member and the blanking plate according to Embodiment 2.

FIG. 13 is a schematic diagram for explaining the size of multiple beams between the multi-beam forming aperture member and the blanking plate according to Embodiment 2. In FIG. 13, the multi-beams 20 formed by passing through a plurality of holes 22 of the multi-beam forming aperture member 203 are refracted by the electromagnetic lens 212 and further refracted by the electromagnetic lens 213 so as to be converged. Then, passage of the scattered electron 300 deviated from the convergence point is restricted by the limiting aperture member 216 (the second aperture member) arranged at the convergence position. The multi-beams 20 whose scattered electrons were blocked by the limiting aperture member 216 are refracted by the electromagnetic lens 215, and further refracted by the electromagnetic lens 214, so as to be almost vertically projected on the blanking plate 204. At this time, the size of the multi-beams 20 can be variable even without moving the arrangement position of the electromagnetic lenses, by making the magnetization ratio R1/R2 of the plural electromagnetic lenses 212 and 213 and the magnetization ratio r1/r2 of the plural electromagnetic lenses 215 and 214 variable. In other words, the size d1 of the multi-beams 20 formed by the multi-beam forming aperture member 203 and the size d2 of the multi-beams 20 projected on the blanking plate 204 can be changed.

Figures 14A, 14B:
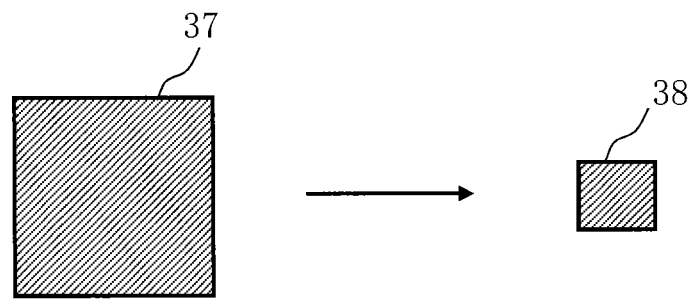
FIGS. 14A and 14B show examples of the size of a pattern image formed by multiple beams according to Embodiment 2.
Figure 15:
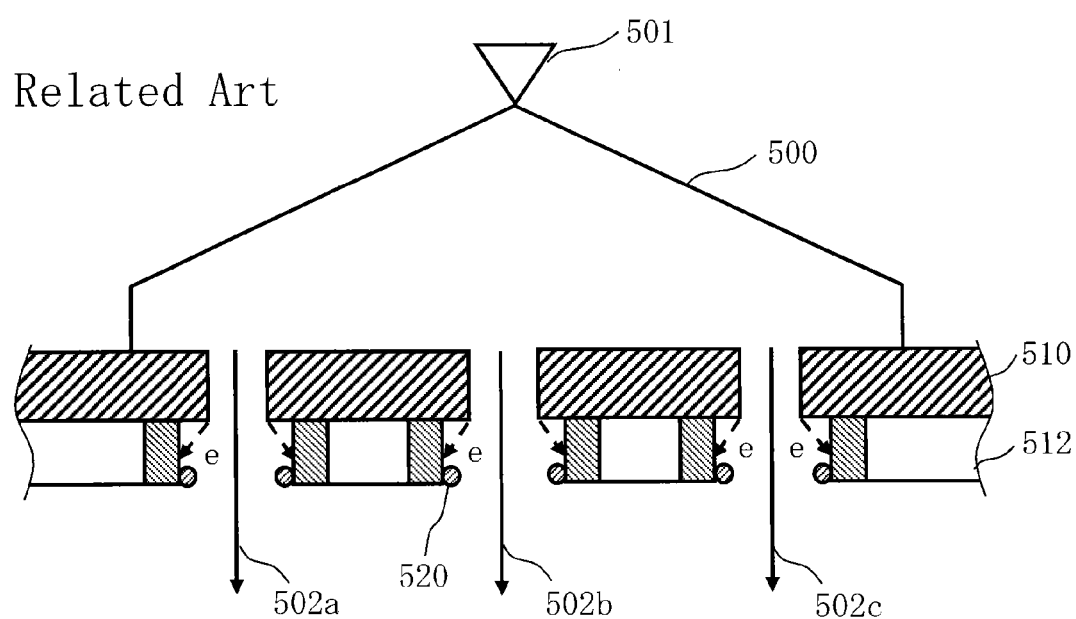
FIG. 15 shows a part of the structure of a writing apparatus of a multi-beam system.

FIGS. 14A and 14B show examples of the size of the pattern image formed by the multiple beams according to Embodiment 2. For example, the size of a pattern to be irradiated on the target object 101 can be adjusted from a shot pattern 37 having the size of 1:1 shown in FIG. 14A to a shot pattern 38 having a reduced size shown in FIG. 14B by performing excitation so that the beam size may be reduced.

Similarly to Embodiment 1, charged particles scattered by the multi-beam forming aperture can also be blocked in Embodiment 2. Therefore, charging of the blanking deflector array and promoting contamination can be inhibited. As a result, the life of the writing apparatus can be improved. Furthermore, the size of the multi-beams can be changed.

Embodiment has been explained referring to concrete examples described above. However, the present invention is not limited to these specific examples. Although the electromagnetic lenses 212, 213, 214, and 215 are used in the example described above, it is also acceptable to use an electrostatic lens. Moreover, although the multiple beams in the beam-on state are deflected to a desired position on the target object 101 by the deflector 208 in the example mentioned above, it is not limited thereto. It is also acceptable to perform irradiation without using the deflector 208. Moreover, although a logic circuit is provided in each blanker in the blanking plate 204 in the example mentioned above, it is not limited thereto. It is also acceptable that the logic circuit is arranged outside the blanking plate 204.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    an emission unit configured to emit a charged particle beam;
    a first aperture member in which a plurality of openings are formed and which is configured to form multiple beams by letting a region including a whole of the plurality of openings be irradiated by the charged particle beam and letting parts of the charged particle beam pass through a corresponding opening of the plurality of openings respectively;
    a blanker array configured to be provided with a plurality of blankers which perform blanking deflection of a corresponding beam respectively in multiple beams having passed through the plurality of openings of the first aperture member;
    a first electromagnetic lens and a second electromagnetic lens arranged between the first aperture member and the blanker array;
    a second aperture member arranged between the first electromagnetic lens and the second electromagnetic lens and at a position of a convergence point of the multiple beams, and configured to restrict passage of charged particles deviated from the convergence point; and
    a third aperture member configured to block each beam of the multiple beams which was deflected to be in a beam off state by the plurality of blankers.

2. The apparatus according to claim 1 further comprising:
    a lens control unit configured to oppositely excite the first electromagnetic lens and the second electromagnetic lens, with a same amount of current.

3. The apparatus according to claim 1,
    wherein the second aperture member is formed of a laminated structure, in which an upper layer member with respect to an incident direction of a beam is formed of a member whose atomic number is lower than that of a lower layer member, and thickness of the upper layer member is thicker than a range of the charged particle beam.

4. The apparatus according to claim 1,
    wherein the second aperture member is used as a differential pumping member which separates a vacuum chamber at a beam upstream side and a vacuum chamber at a beam downstream side.

5. The apparatus according to claim 1,
    wherein the first electromagnetic lens is arranged between the first aperture member and the second aperture member.

6. The apparatus according to claim 5,
    wherein an opening is formed in the second aperture member, and the first electromagnetic lens converges multiple beams having passed through the plurality of openings of the first aperture member to the opening of the second aperture member.

7. The apparatus according to claim 6,
    wherein the second electromagnetic lens is arranged between the second aperture member and the blanker array.

8. The apparatus according to claim 1,
    wherein the second aperture member blocks scattered electrons which were scattered caused by the first aperture member.

9. The apparatus according to claim 8,
    wherein multiple beams whose scattered electrons were blocked are substantially perpendicularly projected on the blanker array by the second electromagnetic lens.

10. The apparatus according to claim 1,
    wherein each of beam images of multiple beams having passed through the first aperture member is focused at a deflection center of a corresponding blanker of the plurality of blankers, by the first electromagnetic lens and the second electromagnetic lens.

11. The apparatus according to claim 1, further comprising:
    a third electromagnetic lens and a fourth electromagnetic lens arranged between the first aperture member and the blanker array.

12. The apparatus according to claim 11,
    wherein the third electromagnetic lens is arranged between the first electromagnetic lens and the second aperture member.

13. The apparatus according to claim 12,
    wherein the fourth electromagnetic lens is arranged between the second aperture member and the second electromagnetic lens.

14. The apparatus according to claim 11,
    wherein electromagnetic lenses from the first electromagnetic lens to the fourth electromagnetic lens are configured to change a size of the multiple beams to be irradiated on the blanker array and to deflect scattered electrons which were scattered caused by the first aperture member to a position deviated from an opening of the second aperture member.

15. A multi charged particle beam writing method comprising:
    emitting a charged particle beam;
    forming multiple beams, by using a first aperture member in which a plurality of openings are formed, by letting a region including a whole of the plurality of openings be irradiated by the charged particle beam and letting parts of the charged particle beam pass through a corresponding opening of the plurality of openings respectively;
    converging multiple beams which have passed through the first aperture member, before performing blanking deflection of the multiple beams;

restricting passage of charged particles deviated from a convergence point by using a second aperture member, after converging the multiple beams which have passed through the first aperture member and before performing blanking deflection of the multiple beams;

projecting multiple beams which have passed through the second aperture member, on a blanker array having a plurality of blankers;

performing blanking deflection of each corresponding beam in the multiple beams projected on the blanker array, by using the plurality of blankers;

blocking each beam which was deflected to be in a beam-off state by the plurality of blankers, by using a third aperture member; and writing a pattern on a target object by using multiple beams which have passed through the third aperture member.

* * * * *